(12) United States Patent
Bauernfeind et al.

(10) Patent No.: US 11,575,364 B2
(45) Date of Patent: Feb. 7, 2023

(54) APPARATUSES AND METHODS FOR SHIFTING A DIGITAL SIGNAL BY A SHIFT TIME TO PROVIDE A SHIFTED SIGNAL

(71) Applicant: Apple Inc., Cupertino, CA (US)

(72) Inventors: Thomas Bauernfeind, Arbing (AT); Andreas Menkhoff, Oberhaching (DE); Michael Bruennert, Unterhaching (DE)

(73) Assignee: Apple Inc., Cupertino, CA (US)

( * ) Notice: Subject to any disclaimer, the term of this patent is extended or adjusted under 35 U.S.C. 154(b) by 399 days.

(21) Appl. No.: 16/543,756

(22) Filed: Aug. 19, 2019

(65) Prior Publication Data
US 2020/0044626 A1 Feb. 6, 2020

Related U.S. Application Data

(63) Continuation of application No. 15/811,851, filed as application No. PCT/IB2016/053356 on Jun. 8, 2016, now Pat. No. 10,432,173.

(30) Foreign Application Priority Data

Jun. 25, 2015 (DE) .......................... 102015110275.7

(51) Int. Cl.
*H03M 7/00* (2006.01)
*H03H 17/02* (2006.01)
(Continued)

(52) U.S. Cl.
CPC .... *H03H 17/0291* (2013.01); *H03H 17/0018* (2013.01); *H03H 17/0635* (2013.01); *H03F 2200/336* (2013.01)

(58) Field of Classification Search
CPC ........ H03M 5/02; H03M 3/436; H03M 3/496; H03M 5/08; H03H 17/0628; H03H 17/0642; H03H 17/0621; H03H 17/0614
(Continued)

(56) References Cited

U.S. PATENT DOCUMENTS 5,783,974 A 7/1998 Koslov et al.
5,966,415 A * 10/1999 Bliss .................. G11B 20/1403
6,295,325 B1 9/2001 Farrow et al.
(Continued)

FOREIGN PATENT DOCUMENTS

CN 1998133 A 7/2007
CN 101578807 A 11/2009
(Continued)

OTHER PUBLICATIONS

Chen, Yih-Min, "On the Design of Farrow Interpolator for OFDM Receivers with Asynchronous IF Sampling," UTC from IEEE Xplore, Department of Communication Engineering, National Central University, Chung-Li-Taiwan, Oct. 24, 2020, 5 pgs.
(Continued)

*Primary Examiner* — Linh V Nguyen

(74) *Attorney, Agent, or Firm* — Kowert, Hood, Munyon, Rankin & Goetzel, P.C.

(57) ABSTRACT

An apparatus for shifting a digital signal having a first sample rate by a shift time to provide a shifted signal having a second sample rate is provided. The apparatus includes a sample rate converter configured to provide a value of an interpolated signal at a compensated sample time as a sample of the shifted signal, the interpolated signal being based on the digital signal. The sample rate converter is configured to modify a time interval between a sample time of the digital signal and the compensated sample time based on the shift time.

7 Claims, 7 Drawing Sheets

(51) Int. Cl.
*H03H 17/00* (2006.01)
*H03H 17/06* (2006.01)

(58) Field of Classification Search
USPC .......................................... 341/61, 142, 144
See application file for complete search history.

(56) References Cited

U.S. PATENT DOCUMENTS

| | | | | |
|---|---|---|---|---|
| 6,487,672 | B1* | 11/2002 | Byrne | G11B 20/10296 |
| | | | | 713/400 |
| 6,591,283 | B1* | 7/2003 | Conway | G11B 20/10009 |
| | | | | 708/316 |
| 7,298,296 | B1* | 11/2007 | Kamath | H03H 17/0642 |
| | | | | 341/123 |
| 7,345,600 | B1 | 3/2008 | Fedigan | |
| 8,249,936 | B1 | 8/2012 | Francisco et al. | |
| 8,804,874 | B2 | 8/2014 | Wang et al. | |
| 9,654,278 | B2* | 5/2017 | Higashino | H04L 7/0029 |
| 10,432,173 | B2* | 10/2019 | Bauernfeind | H03H 17/0291 |
| 2002/0190880 | A1* | 12/2002 | McLaughlin | H03H 17/0628 |
| | | | | 341/61 |
| 2004/0032350 | A1* | 2/2004 | Knapp | H04J 3/0647 |
| | | | | 341/61 |
| 2005/0058484 | A1* | 3/2005 | Nagae | B41J 3/407 |
| | | | | 400/76 |
| 2005/0114427 | A1 | 5/2005 | Canella et al. | |
| 2005/0280564 | A1* | 12/2005 | Lee | H03H 17/0671 |
| | | | | 341/61 |
| 2010/0091922 | A1 | 4/2010 | Magrath | |
| 2012/0303994 | A1 | 11/2012 | Bauernfeind | |
| 2012/0303996 | A1 | 11/2012 | Bauernfeind | |
| 2013/0002457 | A1 | 1/2013 | Tudose | |
| 2013/0003894 | A1 | 1/2013 | Elenes et al. | |
| 2013/0188749 | A1* | 7/2013 | Wang | H03C 5/00 |
| | | | | 375/296 |
| 2013/0241753 | A1 | 9/2013 | Nozaki et al. | |
| 2013/0287137 | A1* | 10/2013 | Menkhoff | H04L 27/2601 |
| | | | | 375/295 |
| 2014/0361913 | A1 | 12/2014 | Hsieh et al. | |
| 2015/0116014 | A1 | 4/2015 | Winoto | |
| 2015/0200649 | A1* | 7/2015 | Trager | H03H 17/0628 |
| | | | | 341/61 |
| 2015/0372681 | A1* | 12/2015 | Melanson | H03L 1/028 |
| | | | | 331/1 R |

FOREIGN PATENT DOCUMENTS

| | | |
|---|---|---|
| CN | 102288802 A | 12/2011 |
| CN | 102792407 A | 11/2012 |
| CN | 102843332 A | 12/2012 |
| CN | 103098404 A | 5/2018 |
| JP | 2000228775 A | 8/2000 |
| JP | 2005159714 A | 6/2005 |
| KR | 1020100110299 A | 10/2010 |

OTHER PUBLICATIONS

Wubao, Fang, Jianguo, Sun, "Depth imaging technique in complex conditions," Exploration & Production Research Institute, SINOPEC, Beijing, Dec. 2005, English Absliact included, 7 pgs.

First Office Action for Chinese Application No. 2016800301504, dated Nov. 3, 2020, 13 pgs.

\* cited by examiner

APPARATUSES AND METHODS FOR SHIFTING A DIGITAL SIGNAL BY A SHIFT TIME TO PROVIDE A SHIFTED SIGNAL

CROSS-REFERENCE TO RELATED APPLICATIONS

This application is a continuation of U.S. application Ser. No. 15/811,851 filed on Nov. 14, 2017, which was a 35 U.S.C. § 371(c) national stage entry of PCT/IB2016/053356. PCT/IB2016/053356, filed on Jun. 8, 2016, claimed priority to German Application 102015110275.7, filed on Jun. 25, 2015. The contents of the earlier filed applications are incorporated by reference herein in their entirety.

FIELD

Examples relate to shifting digital signals in time. In particular, examples relate to apparatuses and methods for shifting a digital signal by a shift time to provide a shifted signal.

BACKGROUND

In various applications, a digital signal needs to be shifted in time. A digital signal may, e.g., be shifted in time in order to delay the digital signal. For example in mobile communications applications, data samples or symbols of a digital signal are represented by complex numbers or complex-valued symbols which may generally be described by an in-phase (I) and a quadrature (Q) component or a radius (R) and a phase ($\varphi$) component. The I and Q components or the R and $\varphi$ components of the complex-valued samples or symbols are often processed individually before being combined in order to generate a combined signal, e.g., a transmit signal may be generated by combining the individual components of a baseband signal. When being processed individually, the runtime through their respective processing paths may be different for the individual components. When being combined after the individual processing, the individual components might therefore be timely misaligned and cause signal distortion. In order to avoid such a situation, a digital delay block is typically provided within the faster one of the processing paths so that the runtimes of the individual processing paths match and the I and Q components or the R and $\varphi$ components are timely aligned when being combined. An example for such a digital delay block may be a first order all-pass filter, which allows fine delay adjustment. However, such digital filter elements have a comparatively high power consumption, especially when the bandwidth increases. For Universal Mobile Telecommunications Systems (UMTS) with a bandwidth of 3.84 MHz, the power consumption of such digital filters may still be an acceptable fraction of the total power budget for a transmitter. However, for carrier aggregated signals having a bandwidth of e.g. 40 MHz as used within Long Term Evolution (LTE) communication networks, the power consumption of such digital filter elements may digest a major part of the power budget of a transmitter. Hence, there may be a desire to improve shifting digital signals in time.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
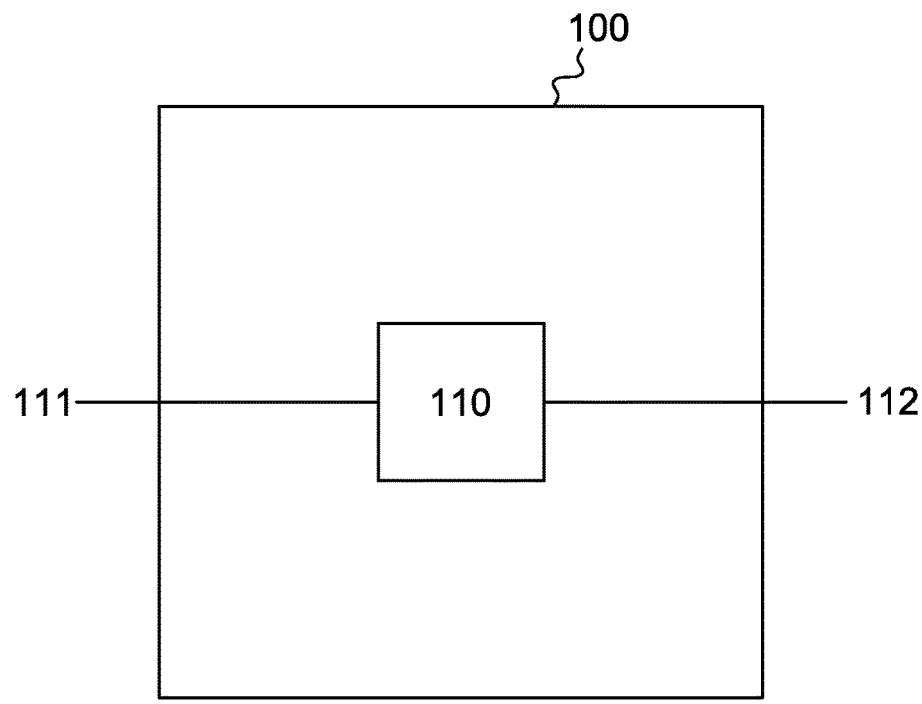
FIG. 1 illustrates an example of an apparatus for shifting a digital signal having a first sample rate by a shift time to provide a shifted signal having a second sample rate.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise, a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates an example of an apparatus 100 for shifting a digital signal 111 having a first sample rate by a shift time to provide a shifted signal 112 having a second sample rate.

The apparatus 100 comprises a sample rate converter 110 for converting the first sample rate of the digital signal 111 to the second sample rate. The first sample rate may be equal to the second sample rate or may be different from the second sample rate. For example, the first sample rate may be lower than the second sample rate or vice versa. The ratio between the first sample and the second sample rate, which is also called sample rate conversion factor, may be an integer number or a non-integer number. That is, the sample rate converter 110 may in some examples be a fractional sample rate converter.

The sample rate converter 110 provides a value of an interpolated signal at a compensated sample time as a sample of the shifted signal 112. The interpolated signal is based (depends) on the digital signal 111 and may represent a continuous or non-continuous wave form comprising the samples of the digital signal 111. For example, the sample rate converter 110 may determine the interpolated signal from samples of the digital signal 111. The sample rate converter 100 may, e.g., provide the value of the interpolated signal as the sample of the shifted signal 112 by evaluating the interpolated signal at the compensated sample time.

A time interval between a sample time of the digital signal 111 and the compensated sample time is modified based on the time shift by the sample rate converter. Accordingly, the shifted signal 112 may be shifted in time with respect to the digital signal 111 by the apparatus 100. The time interval may be constant or it may be time varying to, e.g., implement a variable delay.

For example, the time interval is reduced or increased by the shift time with respect to a time interval between the sample time of the digital signal 111 and a compensated (further) sample time for a shift time of zero. A shift time of zero may be considered as a nominal sample time corresponding to the second sample rate. Accordingly, the shifted signal 112 is not deliberately shifted in time with respect to the digital signal 111 if the shift time is zero. However, there may exist a delay between the signals due to an intrinsic run time of the sample rate converter 110. By reducing the time interval, the shifted signal 112 may be delayed with respect to the digital signal 111. By increasing the time interval, a third signal may be effectively delayed with respect to the shifted signal 112 since the shifted signal 112 effectively advances in time with respect to the third signal.

The apparatus 100 may allow to shift a digital signal in time using inherent characteristics of the sample rate converter 110. The apparatus 100 may allow to shift a digital signal in time while changing or maintaining a sample rate of the digital signal. Accordingly, the apparatus 100 may be used in various applications for, e.g., delaying a digital signal. For example, the apparatus 100 may be used in a circuitry of a loudspeaker or a headset for compensating temperature dependent run-time variations in analog circuits of the loudspeaker or the headset. Furthermore, the apparatus may, e.g., be used to implement signal delays for beamforming in a Multiple Input Multiple Output (MIMO) antenna structure. The apparatus 100 may be further be used in various other applications related to mobile communications. In general, the apparatus 100 may be used in any application for shifting a digital signal in time. Since the shift in time is realized by using the inherent characteristics of the sample rate converter 110, e.g., additional delay elements may be avoided in a circuitry using the apparatus 100. Accordingly, power consumption of the circuitry may be lowered and a required area on a semiconductor substrate carrying the circuitry may be reduced.

The apparatus may comprise one or more additional optional features corresponding to one or more aspects of the proposed concept or one or more examples described below.

Generally speaking, some examples relate to a means for shifting a digital signal having a first sample rate by a shift time to provide a shifted signal having a second sample rate. The means for shifting comprises a means for providing a value of an interpolated signal at a compensated sample time as a sample of the shifted signal, wherein the interpolated signal depending on the digital signal. A time interval between a sample time of the digital signal and the compensated sample time is modified based on the shift time. The means for shifting may be implemented by an apparatus for shifting a digital signal having a first sample rate by a shift time to provide a shifted signal having a second sample rate described above or below (e.g. FIG. 1). The means for providing a value of an interpolated signal may be implemented by a sample rate converter described above or below (e.g. FIG. 1).

Figure 2:
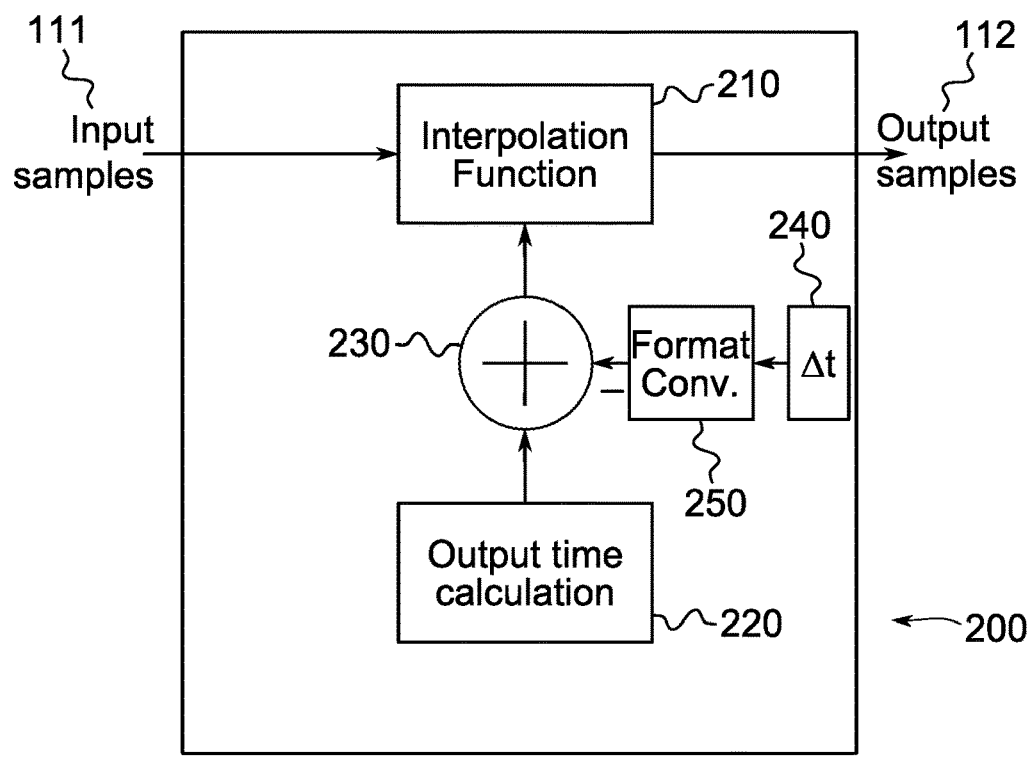
FIG. 2 illustrates an example of an implementation for providing a compensated sample time for a sample of the shifted signal.

FIG. 2 illustrates an example 200 of an implementation for providing a compensated sample time for a sample of the shifted signal. The example 200 may, e.g., be implemented in the sample rate converter 110 illustrated in FIG. 1.

An interpolation unit 210 is provided in a sample rate converter (e.g. sample rate converter 110 illustrated in FIG. 1) to determine an interpolated signal from input samples of the digital signal 111, e.g., a signal related to an interpolation function determined from the input sample of the digital signal 111. In order to be able to provide a sample of the shifted signal 112, an output sample time, e.g., the compensated sample, needs to be provided to the interpolation unit 210. Example 200 illustrates a particular implementation for providing the compensated sample time to the interpolation unit 210.

A nominal sample time corresponding to the second sample rate is calculated by nominal sample time calculation unit 220. As indicated above, the nominal sample time unit 220 corresponds to a compensated sample time for a shift time of zero, i.e., the nominal sample time is a sample time for which a sample rate converter is merely used to convert sample rates, i.e., providing a time instant for an output sample of the signal at the second sample rate. In other words, for a shift time of zero, a sample rate converter according to examples described herein merely converts the digital signal 111 having the first sample rate to the second sample rate without deliberately shifting it in time, i.e., merely the sample rate of the shifted signal 112 is changed compared to the digital signal 111.

The compensated sample time of this particular implementation is provided by adding or subtracting the shift time Δt from the nominal sample time by means of adder 230. The shift time Δt is provided by a shift time provision unit 240. The interpolation unit 210 provides a value of the interpolated signal as the sample of the shifted signal 112 by, e.g., evaluating the interpolated function at the compensated sample time.

Depending on how time is encoded between the adder 230 and the shift time provision unit 240, format conversion may be necessary for the shift time Δt. Therefore, a format conversion unit 250 is provided. For example, in sample rate converters, time may be encoded as ratio between an input rate and an output rate or vice versa. For a static output rate or limited time accuracy requirements, format conversion may be done at startup of the sample rate converter, e.g., format conversion unit 250 may be realized as a firmware routine executed at startup of the sample rate converter. In case of a dynamically varying output rate with high time accuracy requirements, format conversion unit 250 may be implemented as hardware or software block for format conversion. Implementing an additional hardware block for format conversion unit 250 to the sample rate converter 110 to provide for time shift capabilities may be advantageous regarding power consumption and required area on the chip compared to providing digital filters as delay elements.

In other words, the time shift may be implemented using an adder in the sample rate converter 110. Depending on the actual way how time is encoded between both blocks in FIG. 2 (typically as ratio between input and output rate or vice versa), format conversion may be required. For a static output rate or limited accuracy requirements, format conversion could be done once at startup, i.e., as firmware routine. In case of a dynamically varying output rate with high accuracy requirements, a hardware block may be required to do conversion. But even this hardware block may be cheaper in terms of area and power consumption than a digital filter to create a shifted signal.

The example 200 of an implementation for providing a compensated sample time may comprise one or more additional optional features corresponding to one or more aspects of the proposed concept or one or more examples described below.

Figure 3:
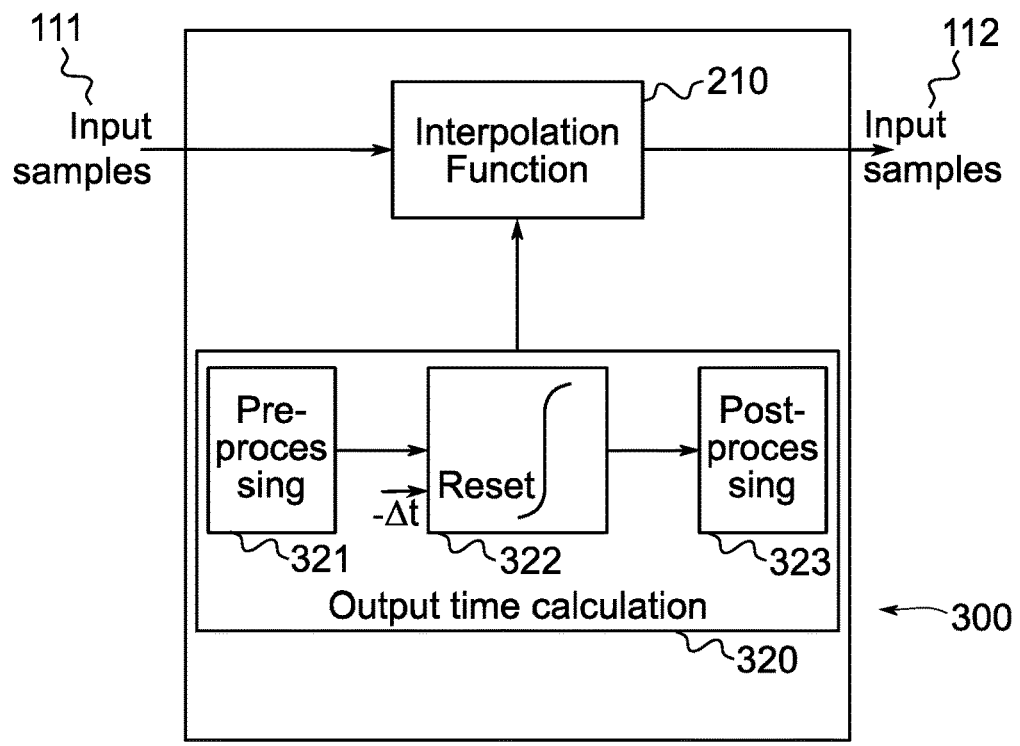
FIG. 3 illustrates another example of an implementation for providing a compensated sample time for a sample of the shifted signal.

FIG. 3 illustrates another example 300 of an implementation for providing a compensated sample time for a sample of the shifted signal. The example 300 may, e.g., be implemented in the sample rate converter 110 illustrated in FIG. 1.

An interpolation unit 210 is provided in a sample rate converter (e.g. sample rate converter 110 illustrated in FIG.

1) to determine an interpolated signal from input samples of the digital signal 111, e.g., a signal related to an interpolation function determined from the input sample of the digital signal 111. In order to be able to provide a sample of the shifted signal 112, an output sample time, e.g., the compensated sample, needs to be provided to the interpolation unit 210. Example 300 illustrates a particular implementation for providing the compensated sample time to the interpolation unit 210.

The compensated sample time is provided by compensated sample time calculation time unit 320. The compensated sample time calculation time unit 320 may be a calculation unit suitable for calculating sample times in case shift time $\Delta t$ is static. A compensated sample time is calculated using a pre-processing unit 321, an integrator 322 and a post-processing unit 323. The static shift time $\Delta t$ allows to provide the compensated sample time by modifying a start value for the integrator 322 by a value related to the shift time $\Delta t$.

In the example 200 given in FIG. 2, the shift time $\Delta t$ is added to or subtracted from the nominal sample time output by nominal sample time calculation unit 220. Compared to the example 200, the example 300 omits additional units for adding the shift time $\Delta t$ to the output of a unit for calculating the sample time. Modifying a start value for an integrator by the shift time within the unit for calculating the sample time omits power consumption of the additional units. Furthermore, no additional area on a semiconductor substrate for the additional units is required. For a static shift time $\Delta t$, the example 300 may therefore be advantageous in terms of power consumption and required area on a semiconductor substrate.

In other words, for a static offset $\Delta t$, one may take advantage of the fact that an output time calculation time block typically employs a kind of integrator. Adding a constant to the output of an integrator is equivalent to starting the integrator with an offset. Adding the time offset as the start value of an integrator doesn't take any additional power.

The example 300 of an implementation for providing a compensated sample time may comprise one or more additional optional features corresponding to one or more aspects of the proposed concept or one or more examples described below.

Figure 4:
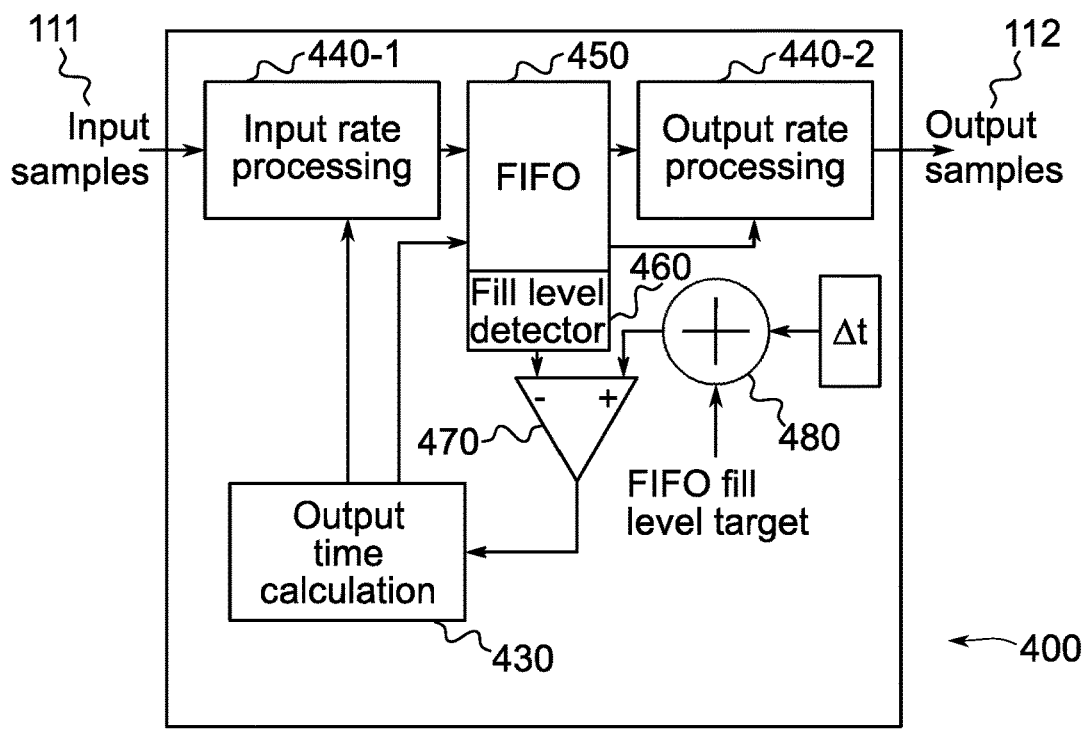
FIG. 4 illustrates another example of an implementation for providing a compensated sample time for a sample of the shifted signal.

FIG. 4 illustrates another example of an implementation for providing a compensated sample time for a sample of the shifted signal. The example 400 may, e.g., be implemented in the sample rate converter 110 illustrated in FIG. 1.

Determining the interpolation signal from input samples of the digital signal 111 is split into first part 440-1 running on the first sample rate and a second part 440-2 running on the second sample rate. Accordingly, an interface between the first part 440-1 and the second part 440-2 may be asynchronous, if the second sample rate is different from the first sample rate. A safe data handover needs to be provided by the interface. Hence, a First-In-First-Out memory (FIFO) 450 may be provided as interface between the first part 440-1 and the second part 440-2.

A fill level of the FIFO 450 is equivalent to a timing relation between the first sample rate and the second sample rate. Hence, modifying the fill level of the FIFO 450 may allow to modify the timing relation between the first sample rate and the second sample rate. For stable operation of a sample rate converter, the timing relation between both sample rates is to be kept unchanged. Accordingly, an average fill level of the FIFO 450 is to be kept constant.

For controlling the fill level of the FIFO 450, a controller or a control loop may be provided, which comprises a fill level detector 460 for detecting the fill level of the FIFO 450, a comparator 470 for comparing the detected fill level to a fill level target value and a sample time calculation unit 430 for calculating the compensated sample times.

A FIFO generally constitutes a delay for data being supplied to it, wherein the delay is related to the fill level of the FIFO. The fill level target value determines the desired fill level of FIFO. Accordingly, controlling the fill level of the FIFO 450 may be used for controlling the timing relation between the first sample rate and the second sample rate and thus for shifting output samples of the shifted signal 112 in time with respect to input samples of the digital signal 111.

The fill level of the FIFO 450 is detected by the fill level detector 460 and compared to a fill level target value by comparator 470. The fill level target value may be manipulated by adding or subtracting a value, which is related to shift time $\Delta t$, to the fill level target value using a first processing unit, e.g., an adder 480. The result of the comparison between the detected fill level and the fill level target value determined by comparator 470 is provided to a second processing unit, e.g., the sample time calculation unit 430. The sample time calculation unit 430 uses the given result (e.g. in an integration process as described in connection with FIG. 3) for calculating the compensated sample time.

The sample time calculation time unit 430 further provides information related to the result of the comparison between the detected fill level and the fill level target value determined by comparator 470 to the FIFO 450.

The timing relation between the first sample rate and the second sample rate, i.e., the time interval between the sample time of the digital signal and the compensated sample time, may be adapted to a desired timing relation by manipulating the fill level target value. An accordingly adjusted compensated sample time may be provided by manipulating the fill level target value for the FIFO 450.

In other words, interpolation function calculation may be split into a part running on the input rate and one running on the output rate. As the interface between both may be considered as asynchronous, some form of safe data handover has to be implemented between both. A FIFO may be one of the options. For stable operation of the system even in case of errors or inaccuracies, there may be a control loop to keep the average fill level of the FIFO constant, which is equivalent to keep a stable timing relation between the input and output sample rate. The control loop may measure the FIFO fill level (i.e. the timing relation between input and output), compare it to a target value and feed the error back into the time calculation function. As the FIFO implements a delay for the samples, changing its average fill level may delay the output samples. Therefore, a wanted time shift $\Delta t$ can be added to the FIFO fill level target and the control loop may adjust the sample generated by the output time calculation block effectively by inserting the required offset into the integrator.

The example 400 of an implementation for providing a compensated sample time may comprise one or more additional optional features corresponding to one or more aspects of the proposed concept or one or more examples described below.

Figure 5:
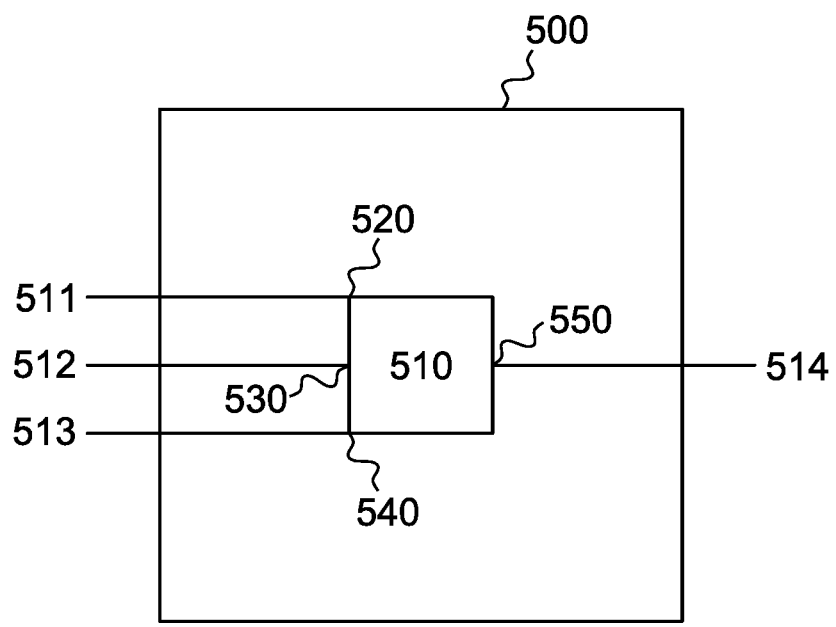
FIG. 5 illustrates an example of an apparatus for shifting a digital signal by a shift time to provide a shifted signal.

FIG. 5 illustrates an example of an apparatus 500 for shifting a digital signal 511 by a shift time to provide a shifted signal 514.

The apparatus 500 comprises a sample rate converter 510 to convert the digital signal 511 having a first sample rate to the shifted signal 514 having a second sample rate. The first sample rate and the second sample rate may be equal or may be different from each other. For example, the first sample rate may be lower than the second sample rate or vice versa. The ratio between the first sample and the second sample rate, which is also called sample rate conversion factor, may be an integer number or a non-integer number. That is, the sample rate converter 510 may in some examples be a fractional sample rate converter.

The sample rate converter 510 adjusts a time interval between a sample time of a sample of the digital signal 511 and a sample time of a sample of the shifted signal 514 based on the shift time. For example, the sample rate converter 510 may increase or reduce the time interval based on the shift time. Accordingly, the apparatus 500 may shift the shifted signal 514 in time with respect to the digital signal 511.

For example, the time interval may be reduced or increased with respect to a hypothetic time interval between the sample time of the digital signal 511 and a sample time of a sample of a shifted signal for a shift time of zero. A shift time of zero may be considered as a nominal sample time corresponding to the second sample rate. Accordingly, the shifted signal 514 is not shifted in time with respect to the digital signal 511 if the shift time is zero. However, there may exist a delay between the signals due to an intrinsic run time of the sample rate converter 510. By reducing the time interval, the shifted signal 514 may be delayed with respect to the digital signal 511. By increasing the time interval, a third signal may be effectively delayed with respect to the shifted signal 514 since the shifted signal 514 effectively advances in time with respect to the third signal.

The apparatus 500 may allow to shift a digital signal in time using inherent characteristics of the sample rate converter 510. The apparatus 500 may allow to shift a digital signal in time while changing or maintaining a sample rate of the digital signal. Accordingly, the apparatus 500 may be used in various applications for, e.g., delaying a digital signal. For example, the apparatus 500 may be used in a circuitry of a loudspeaker or a headset for compensating temperature dependent run-time variations in analog circuits of the loudspeaker or the headset. Furthermore, the apparatus may, e.g., be used to implement signal delays for beamforming in a Multiple Input Multiple Output (MIMO) antenna structure. The apparatus 100 may further be used in various other applications related to mobile communications. In general, the apparatus 500 may be used in any application for shifting a digital signal in time. Since the shift in time is realized by using the inherent characteristics of the sample rate converter 510, e.g., additional delay elements may be avoided in a circuitry using the apparatus 500. Accordingly, power consumption of the circuitry may be lowered and a required area on a semiconductor substrate carrying the circuitry may be reduced.

In some examples, the apparatus 500 may optionally comprise a first input 520 for receiving the digital signal 511, a second input 530 for receiving a first control signal 512 including information on the shift time, and a third input 540 for receiving a second control signal 513 including information on the ratio of the first sample rate to the second sample rate. The apparatus 500 may optionally further comprise an output 550 for providing the shifted signal 514.

The apparatus may comprise one or more additional optional features corresponding to one or more aspects of the proposed concept or one or more examples described above or below. In particular, the sample rate converter 510 may comprise examples of an implementation for providing the sample time of the sample of the shifted signal similar to the examples 200, 300 and 400 of an implementation for providing a compensated sample time for a sample of the shifted signal as illustrated in FIGS. 2 to 4.

Generally speaking, some examples relate to a means for shifting a digital signal by a shift time to provide a shifted signal. The means for shifting comprises a means for converting the digital signal having a first sample rate to the shifted signal having a second sample rate. The means for converting adjusts a time interval between a sample time of a sample of the digital signal and a sample time of a sample of the shifted signal based on the shift time. The means for converting the digital signal may be configured to receive the digital signal at a first means for receiving a signal, to receive a first control signal including information on the shift time at a second means for receiving a signal and to receive a second control signal including information on a ratio of the first sample rate to the second sample rate at a third means for receiving a signal. Further, the means for converting the digital signal may comprise a means for providing the shifted signal. The means for shifting may be implemented by an apparatus for shifting a digital signal by a shift time to provide a shifted signal described above or below (e.g. FIG. 5). The means for converting may be implemented by a sample rate converter described above or below (e.g. FIG. 5). The first, second and third means for receiving a signal may be implemented by an input described above or below (e.g. FIG. 5). The means for providing the shifted signal may be implemented by an output described above or below (e.g. FIG. 5).

Figure 6:
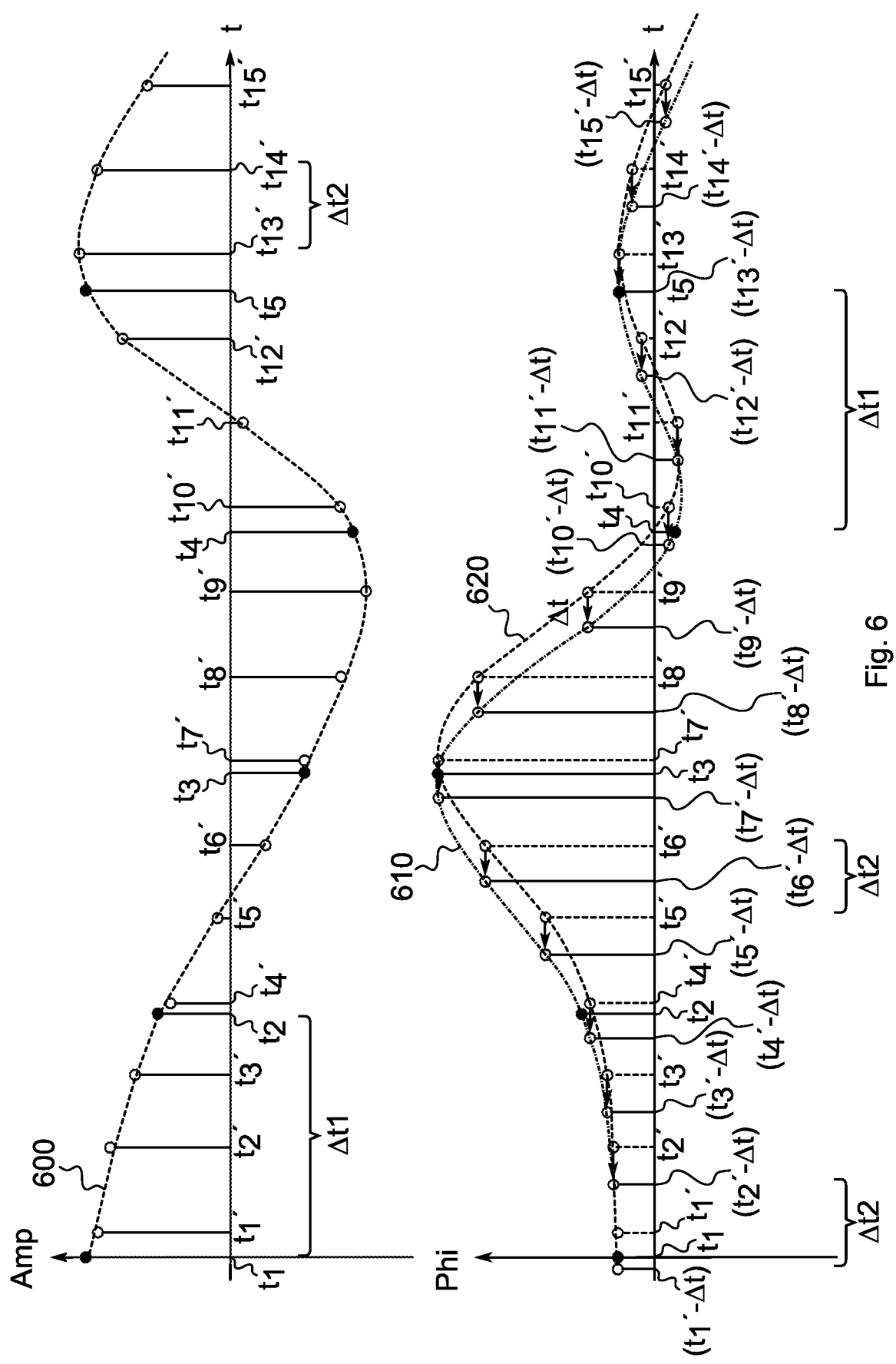
FIG. 6 illustrates examples of a timing diagram for a digital signal and a shifted signal.

FIG. 6 illustrates examples of a timing diagram for a digital signal and a shifted signal. In the upper part and the lower part of FIG. 6, there are illustrated two timing diagrams for sample rate conversion processes of a digital signal according to one or more aspects of the proposed concept or one or more examples described above or below. In the following timing diagrams, the abscissa (t) represents the time axis in arbitrary units and the ordinate (Amp, Phi) represents the magnitude of the signal samples in arbitrary units.

In the sample rate conversion process illustrated in the upper part of FIG. 6, a first sample rate is converted to a second sample rate. That is, an input digital signal is represented by a series of discrete first sample values (solid line with filled circle on top) at first sample times $t_1, \ldots, t_5$. The first sample times $t_1, \ldots, t_5$ are separated by equidistant first time intervals $\Delta t1$ corresponding to the first sample rate. An output shifted signal is represented by a series of discrete second sample values (solid line with empty circle on top) at second sample times $t_1', \ldots, t_{15}'$. The second sample times are separated by equidistant second time intervals $\Delta t2$ corresponding to the second sample rate. The first time interval $\Delta t1$ is different from the second time interval $\Delta t2$, if the first sample rate is different from the second sample rate. In the timing diagram illustrated in the upper part of FIG. 6, it is assumed that the first sample rate is lower than the second sample rate. That is, the first time interval $\Delta t1$ between first sample values is larger than the second time interval $\Delta t2$ between second sample values.

In the sample rate conversion process, a continuous interpolation function may be determined from the discrete first sample values. The continuous interpolation function for the digital signal is shown as dotted line 600 in the upper part of FIG. 6. In order to calculate output samples of the shifted signal, the interpolation function 600 may be evaluated at the second sample times $t_1', \ldots, t_{15}'$.

The sample rate conversion process illustrated in the upper part of FIG. 6 may be an example for a process for shifting a digital signal, wherein the shift time is zero. The second sample times $t_1', \ldots, t_{15}'$ may be regarded as nominal samples times corresponding to the second sample rate.

In the sample rate conversion process illustrated in the lower part of FIG. 6, a similar situation is illustrated. However, the shift time is non-zero.

Again, an input digital signal is represented by a series of discrete first sample values (solid line with filled circle on top) at the first sample times $t_1, \ldots, t_5$ The first sample times $t_1, \ldots, t_5$ are separated by the equidistant first time interval $\Delta t1$ corresponding to the first sample rate. A continuous interpolation function may be determined from the discrete first sample values. The continuous interpolation function for the digital signal is shown as dotted line 610 in the lower part of FIG. 6.

An output shifted signal is represented by a series of discrete third sample values (solid line with empty circle on top) at the third sample times $(t_1'-\Delta t), \ldots, (t_{15}'-\Delta t)$, wherein $\Delta t$ represents the shift time. The third sample times are separated by the equidistant second time interval $\Delta t2$ corresponding to the second sample rate. In order to calculate output samples of the shifted signal, the interpolation function 610 may be evaluated at the third sample times $(t_1'-\Delta t), \ldots, (t_{15}'-\Delta t)$.

For the situation illustrated in the upper part of FIG. 6, a time interval between a sample time of the digital signal and a sample time of the shifted signal is, e.g., $t_1-t_1'$. For the situation illustrated in the lower part of FIG. 6, a time interval between a sample time of the digital signal and a sample time of the shifted signal is, e.g., $t_1-(t_1'-\Delta t)$. That is, a time interval between a sample time of a sample of the digital signal and a sample time of a sample of the shifted signal is adjusted based on the shift time $\Delta t$. In other words, the sample times $t_1'$ and $(t_1'-\Delta t)$ for the shifted signal, i.e., the compensated sample times, are adjusted based on the shift time $\Delta t$.

For illustrative purposes only, a second interpolation function 620 is illustrated as dotted line in the lower part of FIG. 6. The second interpolation function 620 illustrates the interpolated signal for a hypothetical digital signal which is delayed by a time difference $\Delta t$ with respect to the input digital signal, i.e. the hypothetical signal is input to the sample rate conversion process at a time instant which is different by the time difference $\Delta t$ from the time instant the digital signal is provided to the sample rate conversion process. The second interpolation function 620 is evaluated at the second sample times $t_1', \ldots, t_{15}'$ similar to the situation illustrated in the upper part of FIG. 6, i.e., an hypothetical output signal is represented by a series of discrete second sample values (dashed line with empty circle on top) at second sample times $t_1', \ldots, t_{15}'$. Similar to the situation the upper part of FIG. 6, the output samples at the second sample times may be an example for a process for shifting a digital signal, wherein the shift time is zero.

As can be seen from the lower part of FIG. 6, the magnitude of the output samples calculated at sample times $(t1'-\Delta t), \ldots, (t15'-\Delta t)$ for the digital signal is the same as that of the output samples calculated at sample times $t1', \ldots t15'$ for the hypothetical signal. This is due to the fact, that digital signal and hypothetical signal are identical except for the time difference $\Delta t$. Accordingly, calculating output samples at sample times $(t1'-\Delta t), \ldots, (t15'-\Delta t)$ is equivalent to delaying the signal by a time interval $\Delta t$ in order to provide a delayed signal to the sample rate conversion process, which is sampled at nominal sample times $t1', \ldots, t15'$ corresponding to the second sample rate.

It is evident from FIG. 6 that sample rate conversion processes for a digital signal according to one or more aspects of the proposed concept or one or more examples described above or below may be used to adjust a time relation between two digital signals. For example, one signal may be delayed with respect to the other by adjusting the shift time for one or both sample rate conversion processes.

The timing diagrams illustrated in FIG. 6 may be examples for time relations between input samples of the digital signal and output samples of the shifted signal for the apparatus 100 illustrated in FIG. 1 or the apparatus 500 illustrated in FIG. 5.

An example of an implementation using sample rate conversion processes for a digital signal according to one or more aspects of the proposed concept or one or more examples described above is illustrated in FIG. 7.

Figure 7:
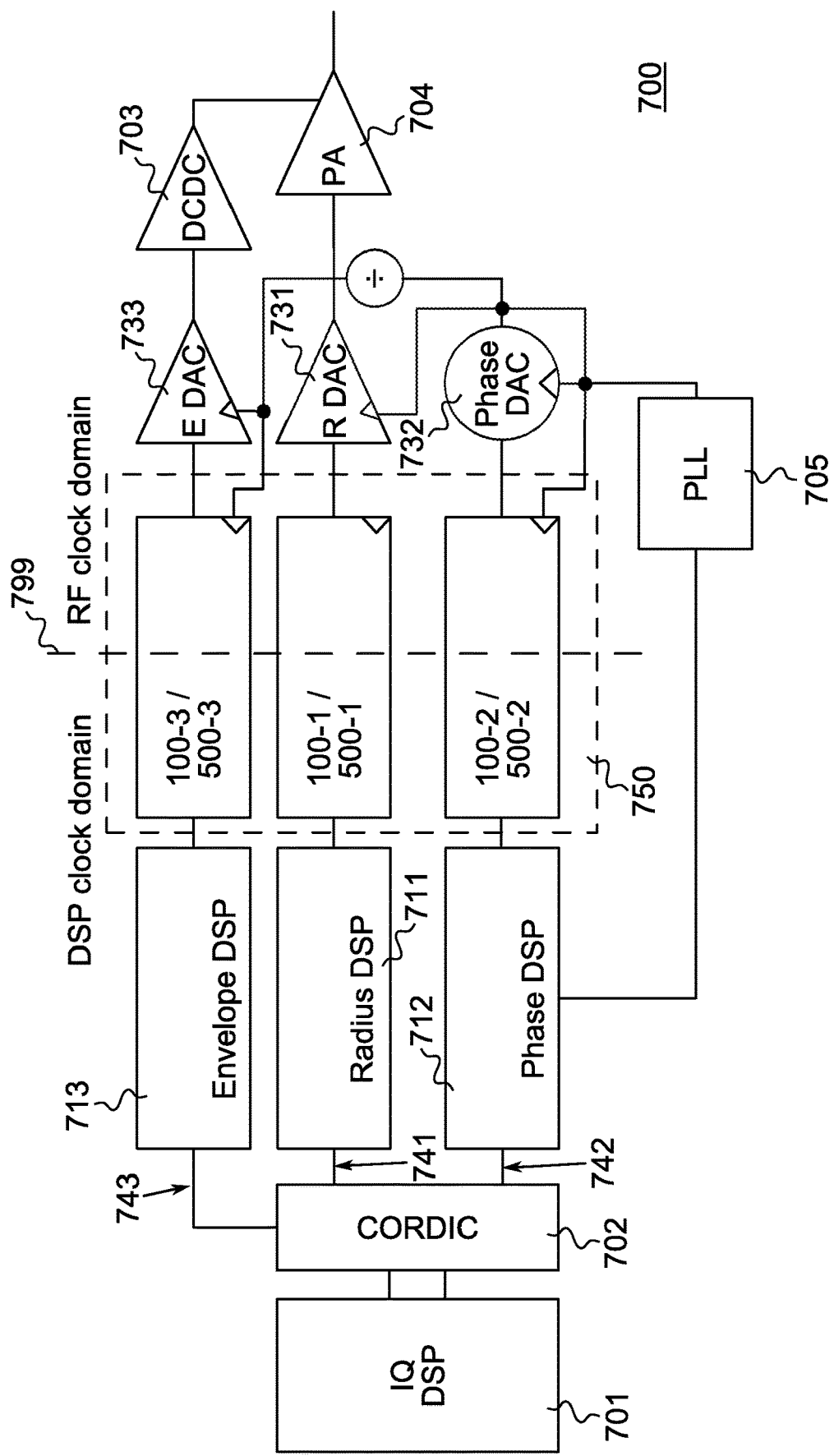
FIG. 7 illustrates an example of a transmitter including a digital modulator comprising an apparatus for shifting a digital signal having a first sample rate by a shift time to provide a shifted signal having a second sample rate or an example of an apparatus for shifting a digital signal by a shift time to provide a shifted signal.

FIG. 7 illustrates an example of a transmitter 700 comprising an apparatus 100 for shifting a digital signal having a first sample rate by a shift time to provide a shifted signal having a second sample rate according to an example described herein and/or an apparatus 500 for shifting a digital signal by a shift time to provide a shifted signal according to an example described herein.

The transmitter 700 is illustrated as an envelope tracking digital polar wireless transmitter. The transmitter 700 comprises an I/Q Digital Signal Processor (DSP) 701 for filter operations on data samples or symbols of an input signal. The data samples or symbols are represented in a Cartesian representation, i.e., by their respective in-phase (I) and quadrature (Q) components. Furthermore, the transmitter 700 comprises a polar coordinate provider 702, e.g., a processing unit configured to execute a CORDIC algorithm (COordinate Rotation DIgital Computer) in order to convert the I/Q representation of the input signal to a polar representation with radius R and phase φ. A separate processing path is provided for each of the radius component, the phase component and an envelope component. Accordingly, Power Amplifier (PA) 704 may be operated in an energy efficient mode based on envelope tracking. In polar representation, the envelope component is equivalent to the radius component. A first processing path 741 is provided for the radius component, a second processing path 742 is provided for the phase component and a third processing path 743 is provided for the envelope component. Within these processing paths, respective DSPs 711, 712, 713 may be provided for processing the particular signal component.

As indicated by dashed line 799, transmitter 700 is divided into a first frequency clock domain, which may be a set of DSP clock domains, and a second frequency clock domain, which may be a RF clock domain determined by a RF clock frequency. The DSP clock domains are typically not synchronous to the RF clock frequency. Therefore, an interface between the first frequency clock domain and the second frequency clock domain is required. The interface is provided by a digital modulator 750. The digital modulator 750 comprises at least a first apparatus 100-1 for shifting a digital signal and a second apparatus 100-2 for shifting a digital signal according to an example described herein. Optionally, the digital modulator 750 may comprise a third apparatus 100-1 for shifting a digital signal according to an example described herein. As alternative, apparatuses 500-1, 500-2, 500-3 for shifting a digital signal according to an example described herein may be provided instead of the apparatuses 100-1, 100-2, 100-3. In some examples, an apparatus 100 may be provided for one of the signal paths 741, 742, 743 and an apparatus 500 may be provided for another one of the signal paths 741, 742, 743. For reasons of simplicity the following description merely refers to the apparatuses 100-1, 100-2, 100-3.

The apparatuses 100-1, 100-2, 100-3 convert the fixed, constant sampling rate in the DSP clock domain for each of the processing paths for the radius component, the phase component and the envelope component to the sampling rate of the RF clock domain, which may be variable.

The runtimes for the particular components within their respective processing paths 741, 742, 743 may be different, so that the particular components might arrive at different time instants at their respective apparatuses 100-1, 100-2, 100-3. The different runtimes with the respective processing paths 741, 742, 743 may be compensated by accurately adjusting the respective shift time of the apparatuses 100-1, 100-2, 100-3. Hence, the apparatuses 100-1, 100-2, 100-3 may provide shifted signals having the sample rate of the second frequency clock domain at a same time instant. That is, the apparatuses 100-1, 100-2, 100-3 may timely align the shifted signals.

The phase component provides the information for the phase of the time varying phase of the resultant radio frequency (RF) signal. After sample rate conversion (and optionally time shifting) in the apparatus 100-2, the phase information given in the phase component is converted into a clock signal for the other parts of transmitter 700 by phase Digital-to-Analog Converter (DAC) 792. The phase DAC 732 may, e.g., be implemented by a Digitally Controlled Oscillator (DCO), a phase mixer or a Digital-to-Time Converter (DTC). Moreover, phase DAC 732 may be part of a Phase-Locked Loop (PLL) 705 which compensates a time varying phase. In order to compensate for the time varying phase, an accurate time alignment between the output signal of phase DAC 732 and a reference signal into PLL 705 is mandatory. Time alignment between these signals may be provided by the apparatus 100-2 by providing the shifted signal with a defined shift time compared to the input digital signal.

The radius information given in the output signal of the apparatus 100-1 is input to radius DAC 731, which is clocked by the output signal of phase DAC 732. Therefore, at a time instant given by the clock signal derived from the phase component, a signal having an amplitude given by the radius information is provided by the radius DAC 731. Hence, the RF signal is provided by the radius DAC 731. The output of radius DAC 731 is provided to PA 704 for amplification and redirection to an antenna element.

In order to assure good performance of transmitter 700 and excellent signal properties, the radius signal and the phase signal need to be exactly time aligned. For carrier aggregated LTE signals, an accuracy in the range of $10^{-12}$ sec (1 ps) is needed. Time alignment of these signals may be achieved by accurately adjusting the respective shift time of the apparatuses 100-1, 100-2.

Amplifier efficiency is generally defined as the level of RF power that may be achieved at the output signal compared to the power that is input into the overall amplification process. To improve amplifier efficiency, envelope tracking of the input signal to the amplifier may be used to vary the amplifier operation based on the detected envelope. In envelope tracking, a variable power supply is utilized for supplying power to the PA 704. The magnitude of the input (baseband) signal is monitored, and the supply voltage that is supplied to the PA 704 is varied based on the monitored magnitude. More specifically, the supply voltage that is supplied to the PA 704 is varied so as to be just sufficient to reproduce the power level required by the PA 704 at a given instant of time. Therefore, at low input power levels corresponding to a low magnitude of the input (baseband) signal, a low supply voltage is provided to the PA 704, and a maximum supply voltage is only provided when maximum power is required, i.e., at magnitude peaks of the input (baseband) signal. The sample rate of the envelope (magnitude) component of the input signal, which is the radius component in polar representation, is converted to the sample rate of the RF clock domain by the apparatus 100-3. The output signal of the apparatus 100-3 is input to the envelope DAC 733, which provides its output to DC-to-DC Converter (DCDC) 703. The output of the envelope DAC 733 may vary according to the magnitude of the envelope component, i.e., according to the required power level. Accordingly, the supply voltage provided by the DCDC 703 to the PA 704 varies. Hence, the PA 704 is supplied with sufficient power to reproduce a power level of the signal to be sent to the antenna element with the required output power. In order to assure correct functioning of PA 704, the supply voltage signal for PA 704 must be closely time aligned to the output radius signal of radius DAC 731, which is supplied to PA 704 for amplification. Time alignment may, e.g., be achieved by accurately adjusting a shift time of the apparatus 100-3.

Regarding the situation illustrated in FIG. 6, a runtime difference Δt between the phase component (illustrated in the lower part of FIG. 6) and the radius component (illustrated in the upper part of FIG. 6) of the transmitter 700 may be compensated by the apparatuses 100-1 and 100-2. Since time alignment of the various signals in the transmitter 700 is achieved by the apparatuses 100-1, 100-2, 100-3, additional delay elements, like digital filters in the DSPs 711, 712, 713, may be omitted in the transmitter 700. Therefore, power consumption and a required area on a semiconductor substrate may be reduced for the transmitter 700.

Figure 8:
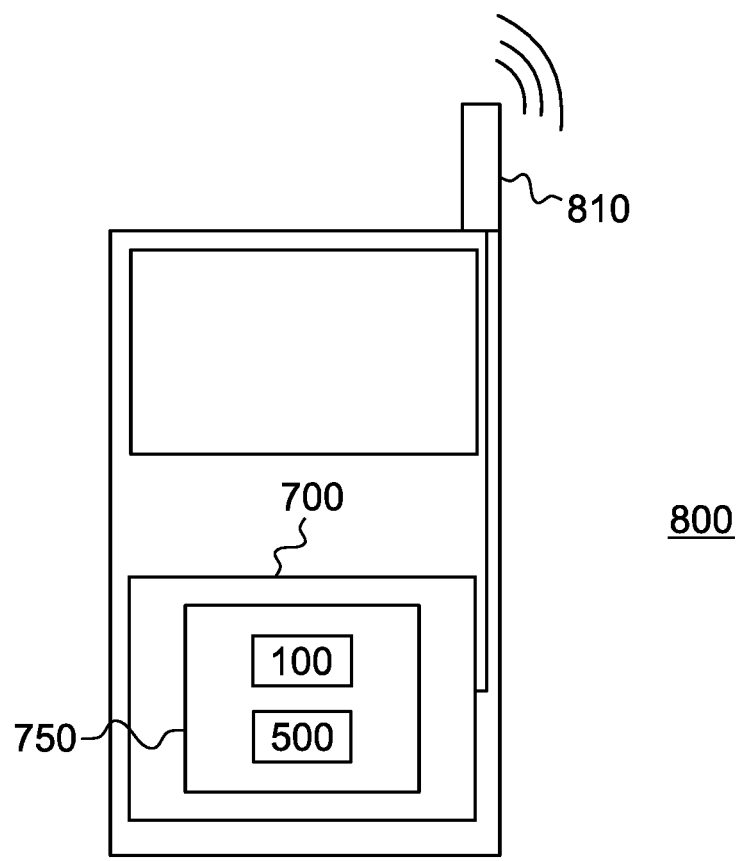
FIG. 8 illustrates an example of a mobile communications device comprising an apparatus for shifting a digital signal having a first sample rate by a shift time to provide a shifted signal having a second sample rate, an example of an apparatus for shifting a digital signal by a shift time to provide a shifted signal, an example of a digital modulator or an example of a transmitter.

FIG. 8 schematically illustrates an example of a mobile communications device or mobile phone or user equipment 800 comprising an apparatus 100 for shifting a digital signal having a first sample rate by a shift time to provide a shifted signal having a second sample rate according to an example described herein and/or an apparatus 500 for shifting a digital signal by a shift time to provide a shifted signal according to an example described herein. The apparatus 100 and/or the apparatus 500 may be comprised in transmitter 700. In some examples, the apparatus 100 and/or the apparatus 500 may be comprised in a digital modulator 750 according to an example described herein. In some examples, the digital modulator 750 may be comprised in the transmitter 700. An antenna element 810 of the mobile communications device 800 may be coupled to the transmitter 700 to radiate a signal into the environment and to wirelessly transmit the signal. To this end, mobile communications devices may be provided having reduced power consumption caused by delay elements used therein.

Figure 9:
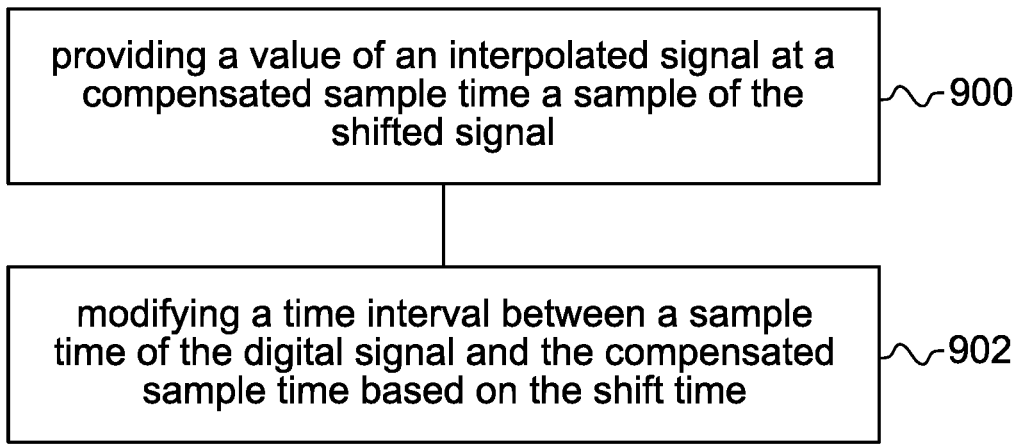
FIG. 9 illustrates a flowchart of an example of a method for shifting a digital signal having a first sample rate by a shift time to provide a shifted signal having a second sample rate.

An example of a method for shifting a digital signal having a first sample rate by a shift time to provide a shifted signal having a second sample rate is illustrated by means of a flowchart in FIG. 9. The method comprises providing 900 a value of an interpolated signal at a compensated sample time as a sample of the shifted signal, wherein the interpolated signal depends on the digital signal. Further, the method comprises modifying 902 a time interval between a sample time of the digital signal and the compensated sample time based on the shift time.

More details and aspects of the method are mentioned in connection with the proposed concept or one or more examples described above or below (e.g. FIGS. 1-8). The method may comprise one or more additional optional features corresponding to one or more aspects of the proposed concept or one or more examples described above or below.

Figure 10:
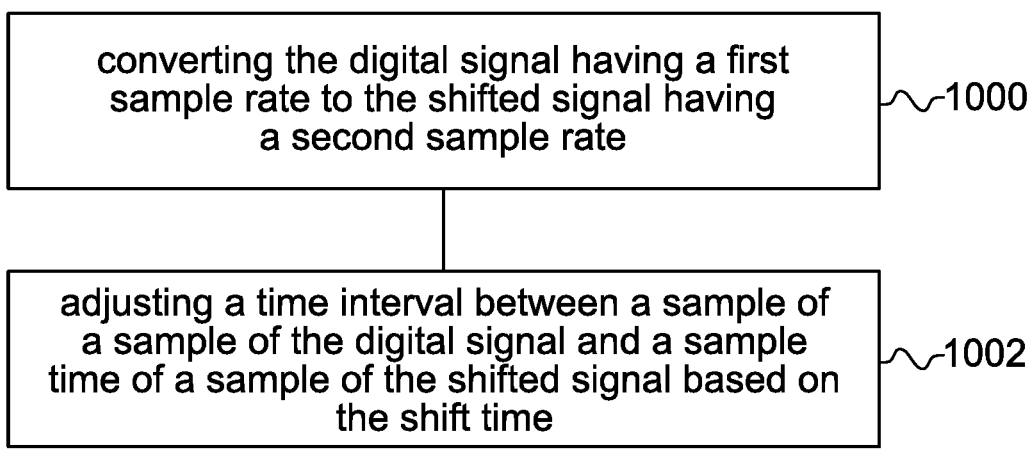
FIG. 10 illustrates a flowchart of an example of a method for shifting a digital signal by a shift time to provide a shifted signal.

An example of a method for shifting a digital signal by a shift time to provide a shifted signal is illustrated by means of a flowchart in FIG. 10. The method comprises converting 1000 the digital signal having a first sample rate to the shifted signal having a second sample rate. Further, the method comprises adjusting 1002 a time interval between a sample time of a sample of the digital signal and a sample time of a sample of the shifted signal based on the shift time.

More details and aspects of the method are mentioned in connection with the proposed concept or one or more examples described above or below (e.g. FIGS. 1-8). The method may comprise one or more additional optional features corresponding to one or more aspects of the proposed concept or one or more examples described above or below.

The examples as described herein may be summarized as follows:

Example 1 is an apparatus for shifting a digital signal having a first sample rate by a shift time to provide a shifted signal having a second sample rate, comprising: a sample rate converter configured to provide a value of an interpolated signal at a compensated sample time as a sample of the shifted signal, the interpolated signal being based on the digital signal, wherein the sample rate converter is configured to modify a time interval between a sample time of the digital signal and the compensated sample time based on the shift time.

In example 2, the sample rate converter of the apparatus of example 1 is configured to reduce or increase the time interval by the shift time with respect to a time interval between the sample time of the digital signal and a compensated sample time for a shift time of zero.

In example 3, the sample rate converter of the apparatus of example 1 or example 2 is configured to provide the compensated sample time by adding or subtracting the shift time from a nominal sample time corresponding to the second sample rate.

In example 4, the sample rate converter of the apparatus of example 1 or example 2 comprises at least an integrator to provide the compensated sample time, and wherein the sample rate converter is configured to provide the compensated sample time by modifying a start value for the integrator by a value related to the shift time.

In example 5, the sample rate converter of the apparatus of example 1 or example 2 comprises a First-In-First-Out memory and a controller configured to control a fill level of the First-In-First-Out memory.

In example 6, the controller of the apparatus of example 5 comprises: a fill level detector configured to detect a present fill level of the First-In-First-Out memory; a first processing unit configured to adjust a fill level target value for the First-In-First-Out memory; a comparator configured to compare the present fill level of the First-In-First-Out memory with the fill level target value; and a second processing unit configured to control the compensated sample time based on a comparison result of the comparator.

In example 7, the sample rate converter of the apparatus of any of the preceding examples is a fractional sample rate converter.

Example 8 is an apparatus for shifting a digital signal by a shift time to provide a shifted signal, comprising: a sample rate converter configured to convert the digital signal having a first sample rate to the shifted signal having a second sample rate, wherein the sample rate converter is configured to adjust a time interval between a sample time of a sample of the digital signal and a sample time of a sample of the shifted signal based on the shift time.

In example 9, wherein the sample rate converter of the apparatus of example 8 is configured to receive the digital signal at a first input, to receive a first control signal including information on the shift time at a second input and to receive a second control signal including information on a ratio of the first sample rate to the second sample rate at a third input.

In example 10, the sample rate converter of the apparatus of example 9 comprises an output configured to provide the shifted signal.

In example 11, the sample time of the sample of the shifted signal is provided by adding or subtracting the shift time from a nominal sample time corresponding to the second sample rate in the apparatus of any of examples 8 to 10.

In example 12, the sample rate converter of the apparatus of any of examples 8 to 10 comprises at least an integrator to provide the sample time of the sample of the shifted signal, and the sample time of the sample of the shifted signal is provided by modifying a start value for the integrator by a value related to the shift time.

In example 13, the sample rate converter of the apparatus of any of examples 8 to 10 comprises a First-In-First-Out memory and a controller configured to control a fill level of the First-In-First-Out memory.

In example 14, the controller of the apparatus of example 13 comprises: a fill level detector configured to detect a present fill level of the First-In-First-Out memory; a first processing unit configured to adjust a fill level target value for the First-In-First-Out memory; a comparator configured to compare the present fill level of the First-In-First-Out memory with the fill level target value; and a second processing unit configured to control the sample time of the sample of the shifted signal based on a comparison result of the comparator.

In example 15, the sample rate converter of the apparatus of any of examples 8 to 14 is a fractional sample rate converter.

Example 16 is a digital modulator for generating a radio frequency signal using a first digital signal and a second digital signal, comprising: a first apparatus for shifting a digital signal according to any of examples 1 to 7 for converting a sample rate of the first digital signal from a first sample rate to a second sample rate; and a second apparatus for shifting a digital signal according to any of examples 1 to 7 for converting a sample rate of the second digital signal from the first sample rate to the second sample rate, wherein the time interval between the sample time of the first digital signal and the compensated sample time for the first apparatus is different by an offset from the time interval between the sample time of the second digital signal and the compensated sample time for the second apparatus.

In example 17, the offset is chosen such that the shifted signal related to the first digital signal and the shifted signal related to the second digital signal are timely aligned in the digital modulator of example 16.

Example 18 is a digital modulator for generating a radio frequency signal using a first digital signal and a second digital signal, comprising: a first apparatus for shifting a digital signal according to any of examples 8 to 15 for converting a sample rate of the first digital signal from a first sample rate to a second sample rate; and a second apparatus for shifting a digital signal according to any of examples 8 to 15 for converting a sample rate of the second digital signal from the first sample rate to the second sample rate, wherein the time interval between the sample time of the sample of the first digital signal and the sample time of the sample of the shifted signal for the first apparatus is different by an offset from the time interval between the sample time of the sample of the second digital signal and the sample time of the sample of the shifted signal for the second apparatus.

In example 19, the offset is chosen such that the shifted signal related to the first digital signal and the shifted signal related to the second digital signal are timely aligned in the digital modulator of example 18.

Example 20 is a transmitter comprising an apparatus for shifting a digital signal according to any of examples 1 to 7, an apparatus for shifting a digital signal according to any of examples 8 to 15 or a digital modulator according to any of examples 16 to 19.

Example 21 is a mobile communications device comprising a transmitter according to example 20.

In example 22, the mobile communications device of example 21 further comprises at least one antenna element coupled to the transmitter.

Examples 23 is a means for shifting a digital signal having a first sample rate by a shift time to provide a shifted signal having a second sample rate, comprising: a means for providing a value of an interpolated signal at a compensated sample time as a sample of the shifted signal, the interpolated signal depending on the digital signal, wherein a time interval between a sample time of the digital signal and the compensated sample time is modified based on the shift time.

In example 24, the time interval is reduced or increased by the shift time with respect to a time interval between the sample time of the digital signal and a compensated sample time for a shift time of zero in the means of example 23.

Example 25 is a means for shifting a digital signal by a shift time to provide a shifted signal, comprising: a means for converting the digital signal having a first sample rate to the shifted signal having a second sample rate, wherein the means for converting is configured to adjust a time interval between a sample time of a sample of the digital signal and a sample time of a sample of the shifted signal based on the shift time.

In example 26, the means for converting the digital signal of the means of example 25 is configured to receive the digital signal at a first means for receiving a signal, to receive a first control signal including information on the shift time at a second means for receiving a signal and to receive a second control signal including information on a ratio of the first sample rate to the second sample rate at a third means for receiving a signal.

In example 27, the means for converting the digital signal of the means of example 26 comprises a means for providing the shifted signal.

Example 28 is a method for shifting a digital signal having a first sample rate by a shift time to provide a shifted signal having a second sample rate, comprising: providing a value of an interpolated signal at a compensated sample time as a sample of the shifted signal, the interpolated signal depending on the digital signal; and modifying a time interval between a sample time of the digital signal and the compensated sample time based on the shift time.

In example 29, modifying the time interval in the method of example 28 comprises reducing or increasing the time interval by the shift time with respect to a time interval between the sample time of the digital signal and a compensated sample time for a shift time of zero.

In example 30, the compensated sample time is provided by adding or subtracting the shift time from a nominal sample time corresponding to the second sample rate in the method of example 28 or example 29.

In example 31, the compensated sample time is provided by integration, and wherein the compensated sample time is provided by modifying a start value for the integration by a value related to the shift time in the method of example 28 or example 29.

Example 32 is a method for shifting a digital signal by a shift time to provide a shifted signal, comprising: converting the digital signal having a first sample rate to the shifted signal having a second sample rate; and adjusting a time interval between a sample time of a sample of the digital signal and a sample time of a sample of the shifted signal based on the shift time.

In example 33, the method of example 32 further comprises: receiving the digital signal; receiving a first control signal including information on the shift time; and receiving a second control signal including information on a ratio of the first sample rate to the second sample rate.

In example 34, the method of example 33 further comprises providing the shifted signal.

Example 35 is a computer readable storage medium having stored thereon a program having a pro-gram code for performing the method of any of examples 28 to 34, when the program is executed on a computer or processor.

Example 36 is a computer program having a program code configured to perform the method of any of examples 28 to 34, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent claim or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. An apparatus for time-shifting a digital signal by a shift time while converting a sample rate of the digital signal, the apparatus comprising: a sample rate converter configured to evaluate an interpolation function determined based on input samples of the digital signal at a compensated sample time to generate output samples, wherein the input samples have a first sample rate and the output samples have a second sample rate, and the compensated sample time is determined based on a shift time between the output samples and the input samples; wherein the sample rate converter comprises: a nominal sample time calculation unit configured to determine a nominal sample time corresponding to the second sample rate; and an adder for adding or subtracting the shift time to or from the nominal sample time to obtain the compensated sample time; wherein the sample rate converter comprises a format conversion unit to match a format of the shift time and the nominal sample time.

2. A transmitter comprising: a first circuitry configured to process a digital signal at a first clock rate; a digital modulator configured to time-shift an output of the first circuitry by a shift time while converting a sample rate of the digital signal; and a second circuitry configured to process an output of the digital modulator at a second clock rate; wherein the digital modulator comprises: a sample rate converter configured to evaluate an interpolation function determined from input samples of the digital signal at a compensated sample time to generate output samples, wherein the input samples have a first sample rate and the output samples have a second sample rate, and the compensated sample time is determined based on a shift time between the output samples and the input samples.

3. The transmitter of claim 2, wherein each of the first circuitry and the second circuitry includes a plurality of processing paths and the digital modulator is configured to adjust shift times on the plurality of processing paths to timely align outputs on the plurality of processing paths.

4. The transmitter of claim 3 wherein the plurality of processing paths include a processing path for a radius component of a transmit signal, a processing path for a phase component of the transmit signal, and/or a processing path for an envelope component of the transmit signal.

5. The transmitter of claim 2 wherein the first circuitry is a digital signal processor running on a digital signal processor clock domain and the second circuitry is a radio frequency (RF) circuitry running on an RF clock domain.

6. The transmitter of claim 2, wherein the shift time is variable over time.

7. The transmitter of claim 2, wherein the ratio of the first sample rate and the second sample rate is fractional.

* * * * *